(12) United States Patent
Gu et al.

(10) Patent No.: US 10,290,726 B2
(45) Date of Patent: May 14, 2019

(54) LATERAL INSULATED GATE BIPOLAR TRANSISTOR

(71) Applicant: CSMC TECHNOLOGIES FAB2 CO., LTD., Jiangsu (CN)

(72) Inventors: Yan Gu, Jiangsu (CN); Wei Su, Jiangsu (CN); Sen Zhang, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 15/548,290

(22) PCT Filed: Jan. 28, 2016

(86) PCT No.: PCT/CN2016/072435
§ 371 (c)(1),
(2) Date: Aug. 2, 2017

(87) PCT Pub. No.: WO2016/124093
PCT Pub. Date: Aug. 11, 2016

(65) Prior Publication Data
US 2018/0012980 A1  Jan. 11, 2018

(30) Foreign Application Priority Data
Feb. 2, 2015  (CN) .......................... 2015 1 0054601

(51) Int. Cl.
*H01L 29/10* (2006.01)
*H01L 29/40* (2006.01)
(Continued)

(52) U.S. Cl.
CPC ...... *H01L 29/7394* (2013.01); *H01L 29/1037* (2013.01); *H01L 29/1095* (2013.01);
(Continued)

(58) Field of Classification Search
CPC ............. H01L 29/7394; H01L 29/1037; H01L 29/1095; H01L 29/402; H01L 29/4236; H01L 29/735
See application file for complete search history.

(56) References Cited

U.S. PATENT DOCUMENTS 5,227,653 A   7/1993 Sin et al.
5,773,852 A   6/1998 Han et al.
(Continued)

FOREIGN PATENT DOCUMENTS

CN   101419981 A   4/2009
CN   102832240 A   12/2012
(Continued)

*Primary Examiner* — Mark W Tornow
(74) *Attorney, Agent, or Firm* — Muncy, Geissler, Olds & Lowe, P.C.

(57) ABSTRACT

A lateral insulated gate bipolar transistor, comprising: a substrate (100), having a first conductivity type; an insulating layer (200), formed on the substrate (100); an epitaxial layer (300), having a second conductivity type and formed on the insulating layer (200); a field oxide layer (400), formed on the epitaxial layer (300); a first well (500), having the first conductivity type; a plurality of gate trench structures (600); second source doped regions (720), having the second conductivity type; first source doped regions (710), having the first conductivity type; a second well (800), having the second conductivity type; a first drain doped region (910), having the first conductivity type and formed on a surface layer of the second well (800); gate lead-out ends (10); a source lead-out end (20); a drain lead-out end (30).

11 Claims, 3 Drawing Sheets

(51) Int. Cl.
*H01L 29/423* (2006.01)
*H01L 29/735* (2006.01)
*H01L 29/739* (2006.01)

(52) U.S. Cl.
CPC ........ *H01L 29/402* (2013.01); *H01L 29/4236* (2013.01); *H01L 29/735* (2013.01)

(56) References Cited

U.S. PATENT DOCUMENTS

| | | | |
|---|---|---|---|
| 2008/0265278 A1* | 10/2008 | Hara | G09G 3/296 257/141 |
| 2009/0194785 A1 | 8/2009 | Lu et al. | |
| 2011/0291157 A1* | 12/2011 | Takahashi | H01L 29/0696 257/144 |
| 2013/0153956 A1* | 6/2013 | Shi | H01L 21/743 257/140 |
| 2016/0111415 A1* | 4/2016 | Basler | H01L 29/7397 257/140 |

FOREIGN PATENT DOCUMENTS

| | | |
|---|---|---|
| CN | 103413824 A | 11/2013 |
| CN | 104040720 A | 9/2014 |
| KR | 99015523 A | 3/1999 |

\* cited by examiner

LATERAL INSULATED GATE BIPOLAR TRANSISTOR

FIELD OF THE INVENTION

The present disclosure relates to the field of semiconductor devices, and more particularly relates to a lateral insulated gate bipolar transistor (LIGBT).

BACKGROUND OF THE INVENTION

Lateral insulated gate bipolar transistor is a transistor that combines the advantages of MOS and bipolar transistors, and it is widely applied to an output stage of a power output drive circuit. Meanwhile, Silicon-on-Insulator (SOI) technology is widely used in manufacturing of power integrated circuit due to its ideal dielectric isolation performance. The SOI-LIGBT device is a LIGBT device based on SOI technology.

In a conventional SOI-LIGBT device, the conductive channel of the device is in a lateral direction, the electron hole current can only drift to the other end through the lateral direction, and the injection of carriers is concentrated on the surface. Therefore, such a single device has a very small working current during conduction. In order to obtain a higher working current, a plurality of cells are required to be added in parallel, which, however lead to a large area of the device, at the same time lead to increase of saturation conduction voltage drop of the device, such that the switching characteristics of the device is also weakened.

SUMMARY OF THE INVENTION

Accordingly, it is necessary to provide a lateral insulated gate bipolar transistor which exhibits the advantages of large working current, small device area, and low conduction voltage drop.

A lateral insulated gate bipolar transistor includes:
a substrate of a first conductivity type;
an insulating layer formed on the substrate;
an epitaxial layer of a second conductivity type formed on the insulating layer;
an field oxide layer formed on the epitaxial layer;
a first well of the first conductivity type formed on the epitaxial layer and positioned on a side of the field oxide layer;
a plurality of gate trench structures embedded in the first well and spaced apart from each other, a bottom of each gate trench structure extends to the epitaxial layer; each gate trench structure comprises a trench and conductive material filled in the trench, an inner sidewall of the trench is provided with a gate insulating layer;
a second source doped region of the second conductivity type formed on a surface of the first well and on both sides of each gate trench structure;
a first source doped region of the first conductivity type formed on a surface of the first well and on a side of the second source doped region away from the gate trench structure;
a second well of the second conductivity type formed on the epitaxial layer and positioned on a side of the field oxide layer away from the first well;
a first drain doped region of the first conductivity type formed on a surface of the second well;
a gate lead-out terminal electrically coupled to the conductive material;
a source lead-out terminal electrically coupled to the second source doped region and the first source doped region; and
a drain lead-out terminal electrically coupled to the first drain doped region.

According to the aforementioned lateral insulated gate bipolar transistor, one or more gate trench structure are added to the source structure of a single cell, and a gate lead-out terminal is led out from the gate trench structure to serve as the gate, such that when a certain voltage is applied to the gate electrode, the gate insulating layer on both sides of the trench and the first well form an inversion layer, i.e., a conductive channel. When a voltage is applied to the drain structure (the first drain doped region), there is a current flowing in the conductive channel. If there are N gate trench structures, then there will be 2N conductive channels flowed by the current, such that the current density in the single cell structure is significantly increased compared with that of the conventional single channel SOI-LIGBT, thus increasing the overall current density of the single device in a multi-cell structure. Accordingly, under the same working current, the greater working current of the single cell structure can enable the device to have a smaller size and lower conduction voltage drop. And under the same device area, the aforementioned lateral insulated gate bipolar transistor can have a greater working current.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The term "and/or" as used herein includes any and all combinations of one or more of the associated listed items.

The terms used in the field of semiconductor have the same meaning as commonly understood by persons of ordinary skill in the art. For example, regarding P-type and N-type impurities, in order to distinguish the doping concentration, the P+-type represents the P-type with heavy doping concentration, the P-type represents the P-type with doping concentration, the P--type represents the P-type with light doping concentration, the N+-type represents the N-type with heavy doping concentration, the N-type represents the N-type with doping concentration, and the N--type represents the N-type with light doping concentration.

Embodiments of the invention are described more fully hereinafter with reference to the accompanying drawings. In the following description, the first conductivity type is P-type and the second conductivity type is N-type.

The First Embodiment

Figure 1:
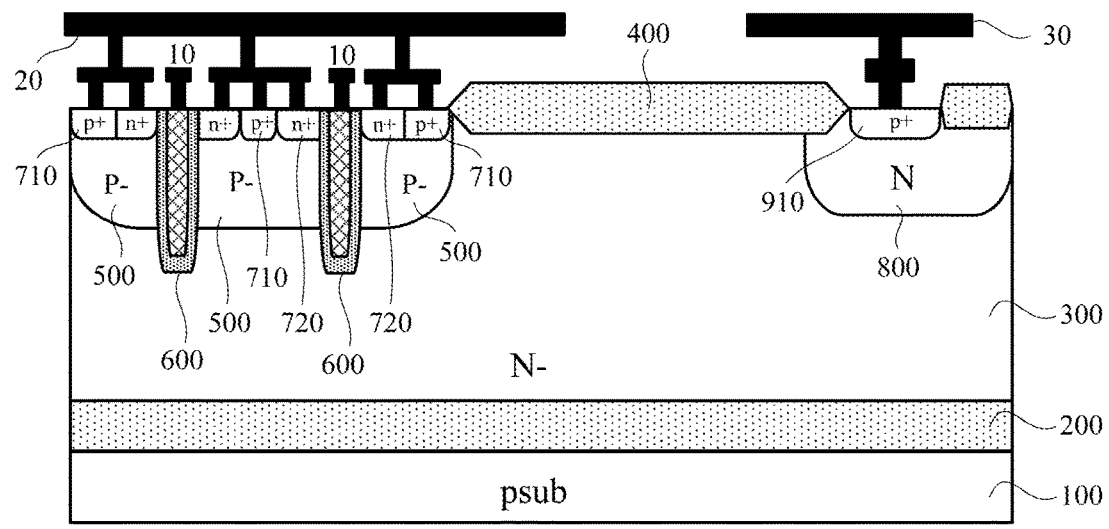
FIG. 1 is a schematic view of a lateral insulated gate bipolar transistor according to a first embodiment.

FIG. 1 is a schematic view of a lateral insulated gate bipolar transistor according to a first embodiment.

The lateral insulated gate bipolar transistor according to the first embodiment includes: a substrate 100 of a first conductivity type, an insulating layer 200, an epitaxial layer 300 of a second conductivity type, an field oxide layer 400, a first well 500 of the first conductivity type, gate trench structures 600, a first source doped region 710 of the first conductivity type, a second source doped region 720 of the second conductivity type, a second well 800 of the second conductivity type, a first drain doped region 910 of the first conductivity type, a gate lead-out terminal 10, a source lead-out terminal 20, and a drain lead-out terminal 30.

The substrate 100 is made of silicon, silicon carbide, gallium arsenide, indium phosphide or germanium silicon. The substrate is a P+-type substrate (P-sub).

The insulating layer 200 is formed on the substrate 100. The insulating layer is made of silicon oxide, such as silicon dioxide. The insulating layer 200 is functionally a buried oxygen layer. The substrate 100 has little effect on the device due to the blocking effect of the insulating layer 200, such that the substrate 100 can be heavily doped (P+).

The epitaxial layer 300 is formed on the insulating layer 200. The epitaxial layer 300 is an N-type epitaxial layer. The epitaxial layer 300 serves as a drift region and has an conductivity type opposite to that of the substrate 100. The epitaxial layer 300 is made of silicon, silicon carbide, gallium arsenide, indium phosphide or germanium silicon.

The field oxide layer 400 is formed on the epitaxial layer 300. The field oxide layer 400 is made of silicon oxide, such as silicon dioxide. The field oxide layer 400 is mainly configured to separate a source structure and a drain structure.

The first well 500 is formed on the epitaxial layer 300 and is positioned on a side of the field oxide layer 400. The first well 500 is a P--type well. As a buffer region for the source structure, the first well has some effects on device conduction hole injection and withstand voltage.

The plurality of gate trench structures 600 are embedded in the first well 500 and spaced apart from each other. A bottom of each gate trench structure 600 extends to the epitaxial layer 300. Each gate trench structure 600 includes a trench 610 and conductive material 620 filled in the trench, an inner sidewall of the trench 610 is provided with a gate insulating layer 630. The conductive material 620 is poly-silicon. The gate insulating layer 630 is made of silicon oxide, such as silicon dioxide. The gate lead-out terminal 10 is electrically coupled to the conductive material 620 in the trench 610. The gate lead-out terminal 10 is a gate contact electrode.

Figure 2:
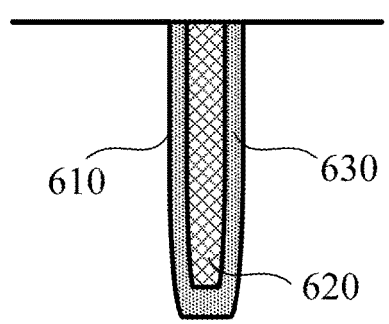
FIG. 2 is an enlarged view of the gate trench structure of FIG. 1.

FIG. 2 is an enlarged view of the gate trench structure.

Since the gate is embedded in the first well 500 in the form of a trench, when a certain voltage is applied to the gate electrode (gate lead-out terminal 10), the gate insulating layer 630 on both sides of the trench 610 and the first well 500 form an inversion layer, i.e., a conductive channel. When a voltage is applied to the drain structure (the first drain doped region 910), there is a current flowing in the conductive channel. If there are N gate trench structures 600, then there will be 2N conductive channels flowed by the current, such that the current density in the single cell structure is significantly increased compared with that of the conventional single channel SOI-LIGBT, thus increasing the overall current density of the single device in a multi-cell structure. Accordingly, under the same working current, the greater working current of the single cell structure can enable the device to have a smaller size and lower conduction voltage drop. And under the same device area, the aforementioned lateral insulated gate bipolar transistor can have a greater working current.

The second source doped region 720 is formed on a surface of the first well 500 and on both sides of each gate trench structure 600. The second source doped region 720 is an N+-type source doped region and is wrapped by the first well 500.

The first source doped region 710 is formed on a surface of the first well 500 and on a side of the second source doped region 720 away from the gate trench structure 600. The first source doped region is a P+-type source doped region and is also wrapped by the first well 500. In other words, the second source doped region 720 and the first source doped region 710 are successively arranged on each side of the gate trench structure 600.

The source lead-out terminal 20 is electrically coupled to the second source doped region 720 and the first source doped region 710. The source lead-out terminal 20 is a source contact electrode.

The second well 800 is formed on the epitaxial layer 300 and is positioned on a side of the field oxide layer 400 away from the first well 500. The second well is an N-type well, which has a middle doping concentration. The first well 500 and the second well 800 are located on opposite sides of the field oxide layer 400.

The first drain doped region 910 is formed on the surface of the second well 800. The first drain doped region 910 is a P+-type drain doped region and is wrapped by the second well 800.

The drain lead-out terminal 30 is electrically coupled to the first drain doped region 910. The drain lead-out terminal 30 is a drain contact electrode.

The gate lead-out terminal 10, the source lead-out terminal 20, and the drain lead-out terminal 30 are usually made of conductive materials, such as copper, aluminum, aluminum-silicon alloy, titanium, titanium nitride, tungsten, polysilicon, metal silicide and the like. The gate lead-out terminal 10, the source lead-out terminal 20, and the drain lead-out terminal 30 can be formed by physical/chemical vapor deposition.

The used raw material is a sandwich structure with the buried oxide layer (insulating layer 200) as the middle layer, i.e., SOI structure. The raw material can also be a two-layered material having the insulating substrate (substrate 100) and a top-layer monocrystalline silicon (the epitaxial layer 300). There is a longitudinal PNP transistor below the drain of the lateral insulated gate bipolar transistor, the PNP transistor is composed by a drain terminal high-doped P-region (the first drain doped region 910), a top-layer silicon N-type embedding region (the second well 800) and a substrate P-type embedding region (substrate 100). When the device is switched on, the PNP transistor is easily to be turned on, which results in that the drain current flows through the transistor to the substrate and thus resulting failure. Therefore, when fabricating device using SOI structure, only the top-layer silicon (the epitaxial layer 300) is used as the device fabrication layer, on which the source, drain, channel region and the like is formed, and the substrate (substrate 100) serves only as a support. In this structure, the buried oxide layer is electrically isolated from the substrate, thus eliminating the formation of the longitudinal PNP transistor from the source. In addition, a dielectric isolation structure is provided between the devices, then a completely isolation of the entire device is achieved.

In the raw materials, the top-layer silicon (the epitaxial layer 300) requires a certain thickness, e.g. greater than a depth of the gate trench structures 600, such that there is enough distance between the gate trench structures 600 and the buried oxide layer (insulating layer 200), and the flow path of electron becomes wider, the on-state resistance becomes smaller in the conducting state, and the distribution of the electric field becomes more uniform in the reverse withstand voltage.

The Second Embodiment

Figure 3:
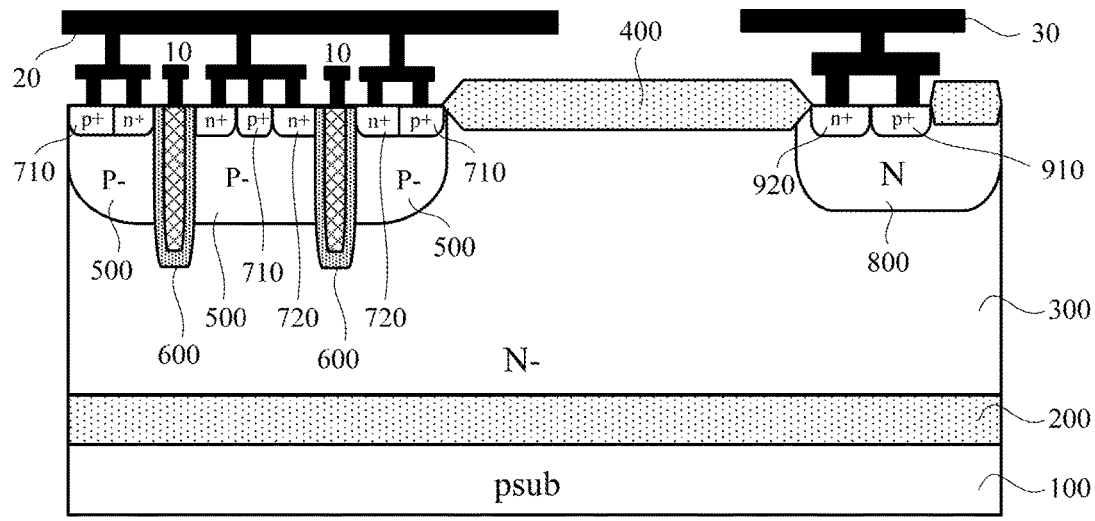
FIG. 3 is a schematic view of a lateral insulated gate bipolar transistor according to a second embodiment.
Figure 4:
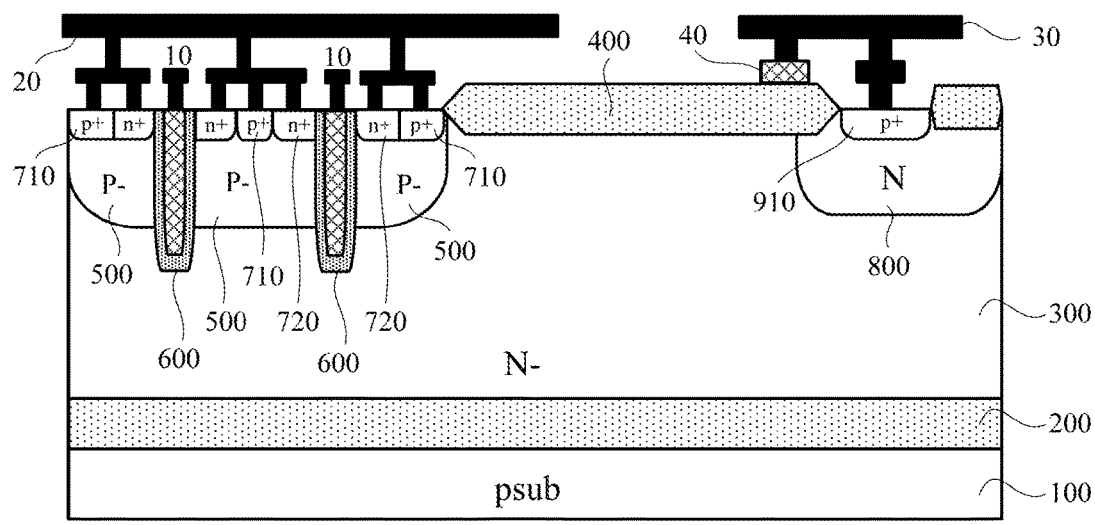
FIG. 4 is a schematic view of a lateral insulated gate bipolar transistor according to a third embodiment.

FIG. 3 is a schematic view of a lateral insulated gate bipolar transistor according to the second embodiment.

The lateral insulated gate bipolar transistor of the second embodiment is similar to that of the first embodiment, and differs in that: the lateral insulated gate bipolar transistor of the second embodiment further includes a second drain doped region 920. The second drain doped region 920 is an N+-type drain doped region, which is formed on the surface of the second well 800. The second drain doped region 920 is sandwiched between the field oxide layer 400 and the first drain doped region 910. The drain lead-out terminal 30 is electrically coupled to the second drain doped region 920.

The second well 800 is firstly shorted with the drain structure and then led out, which has some advantages that, when the device is switched off, the drift region (the epitaxial layer 300) will generate a conductance modulation effect in the conducting state, the stored carriers can flow out directly from the drain via the second drain doped region 920 of the drain structure. Meanwhile, the attenuation process also occurs under the composite effect, thus the problems of large off-tail current and long turn-off time caused by small sub-memory effect of the parasitic PNP transistor in the device are effectively addressed, and the turn-off time is effectively reduced.

The Third Embodiment

The lateral insulated gate bipolar transistor of the third embodiment is substantially the same as the first embodiment, and differs in that it further includes a conductive member 40. The conductive member 40 is formed on a side of the field oxide layer 400 adjacent to the second well 800. The drain lead-out terminal 30 is electrically coupled to the conductive member 40. The conductive member 40 can be made of polysilicon.

When the device is under a reverse voltage, the conductive member 40 has the same potential as the drain structure, such that the potential of the oxide layer structure 400 has a substantially linear change from the drain structure to the source structure. The electric field distribution in the drift region (the epitaxial layer 300) also has a linear change, which can assist the drift region to be depleted, and the rate of reverse depletion can be kept uniform. When the concentration of the drift region becomes slightly higher, no local electric field lines are generated which results in the peak electric field. Accordingly, the concentration of the drift region can be slightly increased to reduce the conduction voltage drop, without changing breakdown voltage and breakdown point.

The Fourth Embodiment

Figure 5:
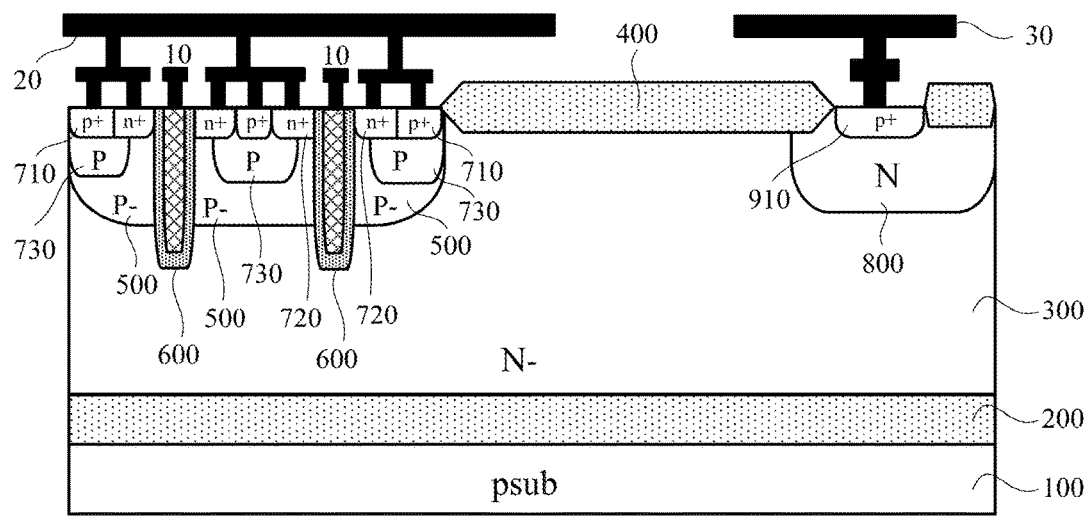
FIG. 5 is a schematic view of a lateral insulated gate bipolar transistor according to a fourth embodiment.

FIG. 5 is a schematic view of a lateral insulated gate bipolar transistor according to a fourth embodiment.

The lateral insulated gate bipolar transistor of the fourth embodiment is substantially the same as the first embodiment, and differs in that it further includes an embedded region 730 of the first conductivity type. The embedded region 730 is a P-type doped region and has a middle doping concentration. The embedded region 730 is formed between the first source doped region 710 and the first well 500. In other words, the first source doped region 710 is wrapped by the embedded region 730, such that the first source doped region 710 is isolated from the first well 500.

When the device is a conduction state, there is a parasitic NPN transistor generated below the source structure. When the condition that the base minority carrier of the transistor can cross is meet, the transistor will be turned on, this will cause the device to fail during the turning on stage. The P-type doped region added below the first source doped region 710 can increase the concentration of the base region of the NPN transistor, the life of the minority carrier is reduced and cannot travel to the emitter, thus it can effectively avoid the phenomenon of turning on of the source parasitic transistor.

According to the aforementioned lateral insulated gate bipolar transistor, one or more gate trench structure are added to the source structure of a single cell, and a gate lead-out terminal is led out from the gate trench structure to serve as the gate, such that when a certain voltage is applied to the gate electrode, the gate insulating layer on both sides of the trench and the first well form an inversion layer, i.e., a conductive channel. When a voltage is applied to the drain structure (the first drain doped region), there is a current flowing in the conductive channel. If there are N gate trench structures, then there will be 2N conductive channels flowed by the current, such that the current density in the single cell structure is significantly increased compared with that of the conventional single channel SOI-LIGBT, thus increasing the overall current density of the single device in a multi-cell structure. Accordingly, under the same working current, the greater working current of the single cell structure can enable the device to have a smaller size and lower conduction voltage drop. And under the same device area, the aforementioned lateral insulated gate bipolar transistor can have a greater working current.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. A lateral insulated gate bipolar transistor, comprising:
a substrate of a first conductivity type;
an insulating layer formed on the substrate;
an epitaxial layer of a second conductivity type formed on the insulating layer;
a field oxide layer formed on the epitaxial layer;
a first well of the first conductivity type formed on the epitaxial layer and positioned on a side of the field oxide layer;
a plurality of gate trench structures embedded in the first well and spaced apart from each other, a bottom of each of the plurality of gate trench structures extending to the epitaxial layer, and said each of the plurality of gate trench structures comprising a trench and conductive material filled in the trench, an inner sidewall of the trench being provided with a gate insulating layer;
a second source doped region of the second conductivity type formed on a surface of the first well and on both sides of each gate trench structure;
a first source doped region of the first conductivity type formed on a surface of the first well and on a side of the second source doped region away from the gate trench structure, the first source doped region being more heavily doped than the first well;
a second well of the second conductivity type formed on the epitaxial layer and positioned on a side of the field oxide layer away from the first well;
a first drain doped region of the first conductivity type formed on a surface of the second well;
a gate lead-out terminal electrically coupled to the conductive material;
a source lead-out terminal electrically coupled to the second source doped region and the first source doped region;
a drain lead-out terminal electrically coupled to the first drain doped region; and
a conductive member formed on a side of the field oxide adjacent to the second well and contacting the field oxide, wherein the drain lead-out terminal is electrically coupled to the conductive member.

2. The lateral insulated gate bipolar transistor according to claim 1, wherein the first conductivity type is P-type, and the second conductivity type is N-type.

3. The lateral insulated gate bipolar transistor according to claim 1, wherein
the substrate is a P+-type substrate, the epitaxial layer is an N--type epitaxial layer,
the first well is a P--type well, the second source doped region is an N+-type source doped region,
the first source doped region is a P+-type source doped region,
the second well is an N-well, and
the first drain doped region is a P+-type drain doped region.

4. The lateral insulated gate bipolar transistor according to claim 1, further comprising a second drain doped region of the second conductivity type, wherein
the second drain doped region is an N+-type drain doped region,
the second drain doped region is formed on the surface of the second well and is sandwiched between the field oxide layer and the first drain doped region, and
the drain lead-out terminal is electrically coupled to the second drain doped region.

5. The lateral insulated gate bipolar transistor according to claim 1, further comprising an embedded region of the first conductivity type formed between the first source doped region and the first well, thereby isolating the first source doped region from the first well.

6. The lateral insulated gate bipolar transistor according to claim 1, wherein the substrate and the epitaxial layer are made of silicon, silicon carbide, gallium arsenide, indium phosphide or germanium silicon.

7. The lateral insulated gate bipolar transistor according to claim 1, wherein the insulating layer, the field oxide layer, and the gate insulating layer are made of silicon oxide.

8. The lateral insulated gate bipolar transistor according to claim 1, wherein the conductive material is polysilicon.

9. The lateral insulated gate bipolar transistor according to claim 1, wherein the gate lead-out terminal is a gate contact electrode, and the source lead-out terminal is a source contact electrode.

10. The lateral insulated gate bipolar transistor according to claim 1, wherein both of the gate insulating layer and the first well form an inversion layer.

11. The lateral insulated gate bipolar transistor according to claim 1, wherein the gate lead-out terminal, the source lead-out terminal, and the drain lead-out terminal are made of copper, aluminum, aluminum-silicon alloy, titanium, titanium nitride, tungsten, polysilicon or metal silicide.

* * * * *